United States Patent
Deng et al.

(10) Patent No.: US 8,738,985 B2
(45) Date of Patent: May 27, 2014

(54) METHODS, SYSTEMS, AND COMPUTER READABLE MEDIA FOR DYNAMICALLY CONTROLLING A TURBO DECODING PROCESS IN A LONG TERM EVOLUTION (LTE) MULTI-USER EQUIPMENT (UE) TRAFFIC SIMULATOR

(75) Inventors: Xinmin Deng, Cary, NC (US); Zhiyong Yan, Cary, NC (US); Ramanathan Asokan, Cary, NC (US)

(73) Assignee: IXIA, Calabasas, CA (US)

( * ) Notice: Subject to any disclaimer, the term of this patent is extended or adjusted under 35 U.S.C. 154(b) by 0 days.

(21) Appl. No.: 13/431,975

(22) Filed: Mar. 28, 2012

(65) Prior Publication Data

US 2013/0262953 A1 Oct. 3, 2013

(51) Int. Cl.
*H03M 13/00* (2006.01)
*H04L 1/18* (2006.01)

(52) U.S. Cl.
USPC ........................... 714/751; 714/752; 714/776

(58) Field of Classification Search
None
See application file for complete search history.

(56) References Cited

U.S. PATENT DOCUMENTS

| | | | |
|---|---|---|---|
| 5,561,841 A | 10/1996 | Markus | |
| 5,850,386 A | 12/1998 | Anderson et al. | |
| 6,771,957 B2 | 8/2004 | Chitrapu | |
| 6,996,772 B2 | 2/2006 | Justice et al. | |
| 7,543,054 B1 | 6/2009 | Bansod et al. | |
| 7,765,313 B2 | 7/2010 | Jain et al. | |
| 2006/0276195 A1 | 12/2006 | Nordling | |
| 2009/0077456 A1* | 3/2009 | Pi et al. | 714/807 |
| 2009/0077457 A1* | 3/2009 | Ramesh et al. | 714/807 |
| 2009/0196244 A1 | 8/2009 | Chun et al. | |
| 2009/0245187 A1 | 10/2009 | Nam et al. | |
| 2010/0075678 A1* | 3/2010 | Akman et al. | 455/436 |
| 2010/0165847 A1 | 7/2010 | Kamuf et al. | |
| 2010/0184447 A1 | 7/2010 | Miki et al. | |
| 2010/0195743 A1 | 8/2010 | Barsoum et al. | |
| 2010/0272011 A1* | 10/2010 | Palanki et al. | 370/328 |
| 2010/0290371 A1 | 11/2010 | Beale | |
| 2010/0303011 A1 | 12/2010 | Pan et al. | |
| 2011/0032925 A1 | 2/2011 | Lee et al. | |
| 2011/0086659 A1 | 4/2011 | Yoon et al. | |
| 2011/0119552 A1* | 5/2011 | Park et al. | 714/751 |
| 2011/0158333 A1* | 6/2011 | Nakano et al. | 375/259 |
| 2011/0170439 A1 | 7/2011 | Miki et al. | |
| 2011/0206151 A1 | 8/2011 | McCloud et al. | |

(Continued)

OTHER PUBLICATIONS

Commonly assigned, co-pending U.S. Appl. No. 13/447,160 for "Methods, Systems, and Computer Readable Media for Heuristics-Based Adaptive Protocol Parsing," (unpublished, filed Apr. 13, 2012).

(Continued)

*Primary Examiner* — Guerrier Merant
(74) *Attorney, Agent, or Firm* — Jenkins, Wilson, Taylor & Hunt, P.A.

(57) ABSTRACT

According to one aspect, the subject matter described herein includes a method for dynamically controlling a Turbo decoding process in a long term evolution (LTE) multi-user equipment (UE) traffic simulator. The method includes steps occurring in an LTE traffic simulator configured to simulate plural UE devices. The steps include receiving, from an evolved NodeB under test, a plurality of transport blocks. The steps also include dynamically determining a maximum number of Turbo decoding iterations for each of the transport blocks. The steps further include Turbo decoding each of the transport blocks for no more than its determined maximum number of Turbo decoding iterations.

19 Claims, 8 Drawing Sheets

(56) References Cited

U.S. PATENT DOCUMENTS

| | | | |
|---|---|---|---|
| 2011/0235586 A1 | 9/2011 | Han et al. | |
| 2012/0033650 A1 | 2/2012 | Ahn et al. | |
| 2012/0042226 A1* | 2/2012 | Ramesh et al. | 714/758 |
| 2012/0051271 A1 | 3/2012 | Beale | |
| 2012/0063384 A1 | 3/2012 | Bi et al. | |
| 2012/0093249 A1* | 4/2012 | Sun et al. | 375/265 |
| 2012/0094651 A1 | 4/2012 | Chun et al. | |
| 2012/0150521 A1 | 6/2012 | Balkwill | |
| 2012/0170524 A1 | 7/2012 | Ren et al. | |
| 2012/0204081 A1* | 8/2012 | Fresia et al. | 714/763 |
| 2013/0010724 A1 | 1/2013 | Han et al. | |
| 2013/0024753 A1* | 1/2013 | Masuda et al. | 714/799 |
| 2013/0034062 A1 | 2/2013 | Seo et al. | |
| 2013/0058240 A1 | 3/2013 | Kim et al. | |
| 2013/0058294 A1 | 3/2013 | Miki et al. | |
| 2013/0058306 A1 | 3/2013 | Noh et al. | |
| 2013/0060735 A1 | 3/2013 | Haddy et al. | |
| 2013/0070689 A1 | 3/2013 | Liu et al. | |
| 2013/0070690 A1 | 3/2013 | Moon et al. | |
| 2013/0088973 A1 | 4/2013 | Yang et al. | |
| 2013/0115987 A1* | 5/2013 | Yoo et al. | 455/501 |
| 2013/0121168 A1 | 5/2013 | Luo et al. | |
| 2013/0121295 A1 | 5/2013 | Saito et al. | |
| 2013/0155867 A1 | 6/2013 | Asokan et al. | |
| 2013/0155872 A1 | 6/2013 | Subramanian et al. | |
| 2013/0155878 A1 | 6/2013 | Deng et al. | |
| 2013/0184023 A1 | 7/2013 | Asokan et al. | |
| 2013/0208600 A1 | 8/2013 | Campbell et al. | |
| 2013/0208603 A1 | 8/2013 | Choi et al. | |
| 2013/0227092 A1 | 8/2013 | Maestas | |
| 2013/0227233 A1 | 8/2013 | Asokan | |
| 2013/0275606 A1 | 10/2013 | Iyer | |

OTHER PUBLICATIONS

Commonly assigned, co-pending U.S. Appl. No. 13/429,384 for "Scalable Architecture for Multiple User Equipment (Multi-UE) Simulation," (unpublished, filed Mar. 25, 2012).

Commonly assigned, co-pending U.S. Appl. No. 13/408,787 for "Methods, Systems, and Computer Readable Media for Integrated Sub-Block Interleaving and Rate Matching," (unpublished, filed Feb. 29, 2012).

Commonly assigned, co-pending U.S. Appl. No. 13/396,577 for "Methods, Systems, and Computer Readable Media for Performing Long Term Evolution (LTE) Channel Delineation," (unpublished, filed Feb. 14, 2012).

Commonly assigned, co-pending U.S. Appl. No. 13/371,389 for "Methods, Traffic Simulators, and Computer Readable Media for Validating Long Term Evolution (LTE) Code Blocks and Transport Blocks," (unpublished, filed Feb. 10, 2012).

Commonly assigned, co-pending U.S. Appl. No. 13/352,058 for "Methods, Systems, and Computer Readable Media for Long Term Evolution (LTE) Uplink Data Processing," (unpublished, filed Jan. 17, 2012).

Commonly assigned, co-pending U.S. Appl. No. 13/336,005 for "Methods, Systems, and Computer Readable Media for Reducing the Impact of False Downlink Control Information (DCI) Detection in Long Term Evolution (LTE) Physical Downlink Control Channel (PDCCH) Data," (unpublished, filed Dec. 23, 2011).

Commonly assigned, co-pending U.S. Appl. No. 13/326,264 for "Methods, Systems, and Computer Readable Media for Improved Long Term Evolution (LTE) Hybrid Automatic Repeat Request (HARQ) Processing," (unpublished, filed Dec. 14, 2011).

"3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 9)," 3GPP TS 36.300, v9.9.0 (Dec. 2011).

"3rd Generation Partnership Project; Universal Mobile Telecommunications System (UMTS); Evolved Universal Terrestrial Radio Access (E-UTRA); Physical layer for relaying operation (Release 10)," 3GPP TS 36.216, v10.3.1 (Sep. 2011).

"3rd Generation Partnership Project; Technical Specification Group Radio Access Network; Evolved Universal Terrestrial Radio Access (E-UTRA); Physical layer procedures (Release 10)," 3GPP TS V10. 3.0 (Sep. 2011).

"3rd Generation Partnership Project; Technical Specification Group Radio Access Network; Evolved Universal Terrestrial Radio Access (E-UTRA); Multiplexing and channel coding (Release 10)," 3GPP TS 36.212, V10.3.0 (Sep. 2011).

"3rd Generation Partnership Project; Technical Specification Group Radio Access Network; Evolved Universal Terrestrial Radio Access (E-UTRA); Physical Channels and Modulation (Release 10)," 3GPP TS 36.211, V10.3.0 (Sep. 2011).

"LTE; Evolved Universal Terrestrial Radio Access (E-UTRA); Physical layer; Measurements (3GPP TS 36.214 version 10.1.0 Release 10)," ETSI TS 136 214 V10.1.0 (Apr. 2011).

Third Generation Partnership Project, "Technical Specification Group Radio Access Network; Evolved Universal Terrestrial Radio Access (E-UTRA); LTE Physical Layer; General Description," 3GPP TS 36.201 v10.0.0, Release 10 (Dec. 2010).

"IxCatapult Chassis," http://www.ixiacom.com/products/display?skey=ch_ixcatapult, pp. 1-2 (Downloaded from the Internet Apr. 14, 2010).

"Wireless Network Testing," Ixia, 915-2623-01 Rev A, pp. 1-18 (Jan. 2010).

"Wireless Network Testing," Ixia, 915-2622-01 Rev A, pp. 1-16 (Jan. 2010).

"3rd Generation Partnership Project; Technical Specification Group Radio Access Network; Requirements for Evolved UTRA (E-UTRA) and Evolved UTRAN (E-UTRAN) (Release 9)," 3GPP TR 25.913, v9.0.0 (Dec. 2009).

"PDCCH Blind Decoding," PDCCH Decoding Example, http://www.steepestascent.com, pp. 1-6 (Copyright 2009-2011, dowloaded from the Internet Dec. 4, 2011).

Non-Final Office Action for U.S. Appl. No. 13/154,166 (Aug. 19, 2013).

Non-Final Office Action for U.S. Appl. No. 13/396,577 (Aug. 8, 2013).

Radio Electronics, "LTE CA: Carrier Aggregation Tutorial," pp. 1-7 http://www.radio-electronics.com/info/cellulartelecomms/lte-long-term-evolution/4g-lte-advanced-carrier-channel-aggregation.php (printed from the Internet Aug. 7, 2013).

Share Technote, "Frame Structure—Downlink," pp. 1-11 http://www.sharetechnote.com/html/FrameStructure_DL.html#PCFICH (Printed from the Internet Aug. 7, 2013).

Non-Final Office Action for U.S. Appl. No. 13/336,005 (Jul. 2, 2013).

Commonly assigned, co-pending U.S. Appl. No. 13/835,658 for "Methods, Systems, and Computer Readable Media for Utilizing Adaptive Symbol Processing in a Multiple User Equipment (Multi-UE) Simulator," (unpublished, filed Mar. 15, 2013).

3rd Generation Partnership Project, "Technical Specification Group Radio Access Network; Evolved Universal Terrestrial Radio Access (E-UTRA); Physical layer procedures (Release 11)," 3GPP TS 36.213, V11.2.0, pp. 1-173 (Feb. 2013).

3rd Generation Partnership Project, "Technical Specification Group Radio Access Network; Evolved Universal Terrestrial Radio Access (E-UTRA); Multiplexing and channel coding (Release 11)," 3GPP TS 36.212, V11.2.0, pp. 1-18 (Feb. 2013).

3rd Generation Partnership Project, "Technical Specification Group Radio Access Network; Evolved Universal Terrestrial Radio Access (E-UTRA); Physical Channels and Modulation (Release 11)," 3GPP TS 36.211, V11.2.0, pp. 1-109 (Feb. 2013).

3rd Generation Partnership Project, "Technical Specification Group Radio Access Network; Evolved Universal Terrestrial Radio Access (E-UTRA); Physical layer; Measurements (Release 11)," 3GPP TS 36.214, V11.1.0, pp. 1-14 (Dec. 2012).

3rd Generation Partnership Project, "Technical Specification Group Radio Access Network; Evolved Universal Terrestrial Radio Access (E-UTRA); LTE physical layer; General description (Release 11)," 3GPP TS 36.201, V11.1.0, pp. 1-13 (Dec. 2012).

(56) References Cited

OTHER PUBLICATIONS

3rd Generation Partnership Project, "Technical Specification Group Radio Access Network; Evolved Universal Terrestrial Radio Access (E-UTRA); Physical layer for relaying operation (Release 11)," 3GPP TS 36.215, V11.0.0, pp. 1-16 (Sep. 2012).

Xiao et al., "IMS Network Deployment Cost Optimization Based on Flow-Based Traffic Model," IEEE/IFIP Network Operations and Management Symposium—NOMS 2010, pp. 232-239 (2010).

"Network Topology," http://web.archive.org/web/20081219235147/http://en.wikipedia.org/wiki/Network_topology, pp. 1-9 (Dec. 19, 2008).

Notice of Allowance and Fee(s) Due for U.S. Appl. No. 13/396,577 (Dec. 18, 2013).

Non-Final Office Action for U.S. Appl. No. 13/447,160 (Nov. 8, 2013).

Non-Final Office Action for U.S. Appl. No. 13/326,264 (Oct. 10, 2013).

\* cited by examiner

| Transport Block | Transport Block Size | Transport Block Code Rate | Associated Channel Condition | Expected Number of Iterations | Predicted Utilization | Utilization Remaining | Assigned Number of Iterations |
|---|---|---|---|---|---|---|---|
| Simulator Initialization State | | | | | | 600 | |
| UE1.1 | 35 kbits | 0.8 | 4 dB | 6 | 210 | 390 | 6 |
| UE1.2 | 35 kbits | 0.8 | 4 dB | 6 | 210 | 180 | 6 |

FIG. 4

| Transport Block | Transport Block Size | Transport Block Code Rate | Associated Channel Condition | Expected Number of Iterations | Predicted Utilization | Utilization Remaining | Assigned Number of Iterations |
|---|---|---|---|---|---|---|---|
| | | Simulator Initialization State | | | | 600 | |
| UE1.1 | 25 kbits | 0.8 | 4 dB | 6 | 150 | 450 | 4 |
| UE1.2 | 50 kbits | 0.8 | 4 dB | 6 | 300 | 150 | 4 |
| UE2.1 | 25 kbits | 0.9 | 6 dB | 6 | 150 | 0 | 4 |
| UE2.2 | 50 kbits | 0.9 | 6 dB | 6 | 300 | -300 | 4 |

FIG. 5

| Transport Block | Transport Block Size | Transport Block Code Rate | Associated Channel Condition | Expected Number of Iterations | Predicted Utilization | Assigned Number of Iterations | Utilization Remaining |
|---|---|---|---|---|---|---|---|
| | | | | Simulator Initialization State | | | 600 |
| UE1.1 | 25 kbits | 0.8 | 4 dB | 6 | 150 | 6 | 450 |
| UE1.2 | 50 kbits | 0.8 | 4 dB | 6 | 300 | 4 | 250 |
| UE2.1 | 25 kbits | 0.9 | 6 dB | 6 | 150 | 3 | 175 |
| UE2.2 | 50 kbits | 0.9 | 6 dB | 6 | 300 | 3 | 25 |

FIG. 6

| Transport Block | Transport Block Size | Transport Block Code Rate | Associated Channel Condition | Expected Number of Iterations | Assigned Number of Iterations | Actual Iterations Required | Unused Iterations |
|---|---|---|---|---|---|---|---|
| UE1.1 | 25 kbits | 0.8 | 4 dB | 6 | 6 | 6 | 0 |
| UE1.2 | 50 kbits | 0.8 | 4 dB | 6 | 6 | 4 | 2 |
| UE2.1 | 25 kbits | 0.2 | 22 dB | 2 | 4 | 3 | 1 |
| UE2.2 | 50 kbits | 0.2 | 22 dB | 2 | 3 | 3 | 0 |

METHODS, SYSTEMS, AND COMPUTER READABLE MEDIA FOR DYNAMICALLY CONTROLLING A TURBO DECODING PROCESS IN A LONG TERM EVOLUTION (LTE) MULTI-USER EQUIPMENT (UE) TRAFFIC SIMULATOR

TECHNICAL FIELD

The subject matter described herein relates to dynamically controlling a Turbo decoding process. More specifically, the subject matter relates to methods, systems, and computer readable media for dynamically controlling a Turbo decoding process in a long term evolution (LTE) multi-user equipment (UE) traffic simulator.

BACKGROUND

As cellular communication technology evolves, providers are able to more effectively utilize their allocated spectrum. Enhanced protocols such as those specified by the 3rd generation partnership project's (3GPP) LTE standards are enabling providers to increase the speed and capacity of their wireless networks. These enhanced protocols, however, are significantly more complex than their predecessors and require the design, integration, and support of new hardware, such as mobile base stations, within a provider's network. The successful implementation of such hardware often requires multiple iterations of testing and refinements in order to meet the specified performance requirements. Testing such hardware, however, is also becoming an increasingly complex task. As the number of UE nodes supported by a base station and the individual demands of such UEs increases, testing hardware must be optimized to effectively simulate such demands.

One aspect of LTE equipment is Turbo decoding. An LTE multi-UE simulator is required to perform Turbo decoding of downlink signals for each UE being simulated. Turbo decoding is an iterative process that corrects bit errors in received data. The amount of error correction improves with the number of iterations for a given block of data. Turbo decoders, however, have finite processing resources and must meet strict time constraints when receiving downlink LTE data.

Accordingly, a need exists for methods, systems, and computer readable media for dynamically controlling a Turbo decoding process in an LTE multi-UE traffic simulator.

SUMMARY

According to one aspect, the subject matter described herein includes a method for dynamically controlling a Turbo decoding process in an LTE multi-UE traffic simulator. The method includes steps occurring in an LTE traffic simulator configured to simulate plural UE devices. The steps include receiving, from an evolved NodeB under test, a plurality of transport blocks. The steps also include dynamically determining a maximum number of Turbo decoding iterations for each of the transport blocks. The steps further include Turbo decoding each of the transport blocks for no more than its determined maximum number of Turbo decoding iterations.

According to another aspect, the subject matter described herein includes a system for simulating plural UE devices and dynamically controlling a Turbo decoding process. The system includes an LTE multi-UE traffic simulator. The LTE multi-UE traffic simulator includes a communication interface configured to receive, from an evolved NodeB under test, a plurality of transport blocks. The LTE multi-UE traffic simulator also includes a digital signal processor (DSP) configured to dynamically determine a maximum number of Turbo decoding iterations for each of the transport blocks. The LTE multi-UE traffic simulator further includes a Turbo decoder configured to decode each of the transport blocks for no more than its determined maximum number of Turbo decoding iterations.

According to another aspect, a running count of the number of used and remaining Turbo decoding iterations during a Turbo decoding process is tracked, enabling the dynamic allocation of Turbo decoding iterations for remaining transport blocks during the Turbo decoding process.

As used herein, the term "node" refers to a physical computing platform including one or more processors and memory.

As used herein, the term "module" refers to software in combination with hardware (such as a processor) and/or firmware for implementing features described herein.

The subject matter described herein can be implemented in software in combination with hardware and/or firmware. For example, the subject matter described herein may be implemented in software executed by one or more processors. In one exemplary implementation, the subject matter described herein may be implemented using a non-transitory computer readable medium having stored thereon computer executable instructions that when executed by the processor of a computer control the computer to perform steps. Exemplary computer readable media suitable for implementing the subject matter described herein include non-transitory computer readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

The subject matter described herein will now be explained with reference to the accompanying drawings of which.

DETAILED DESCRIPTION

Figure 1:
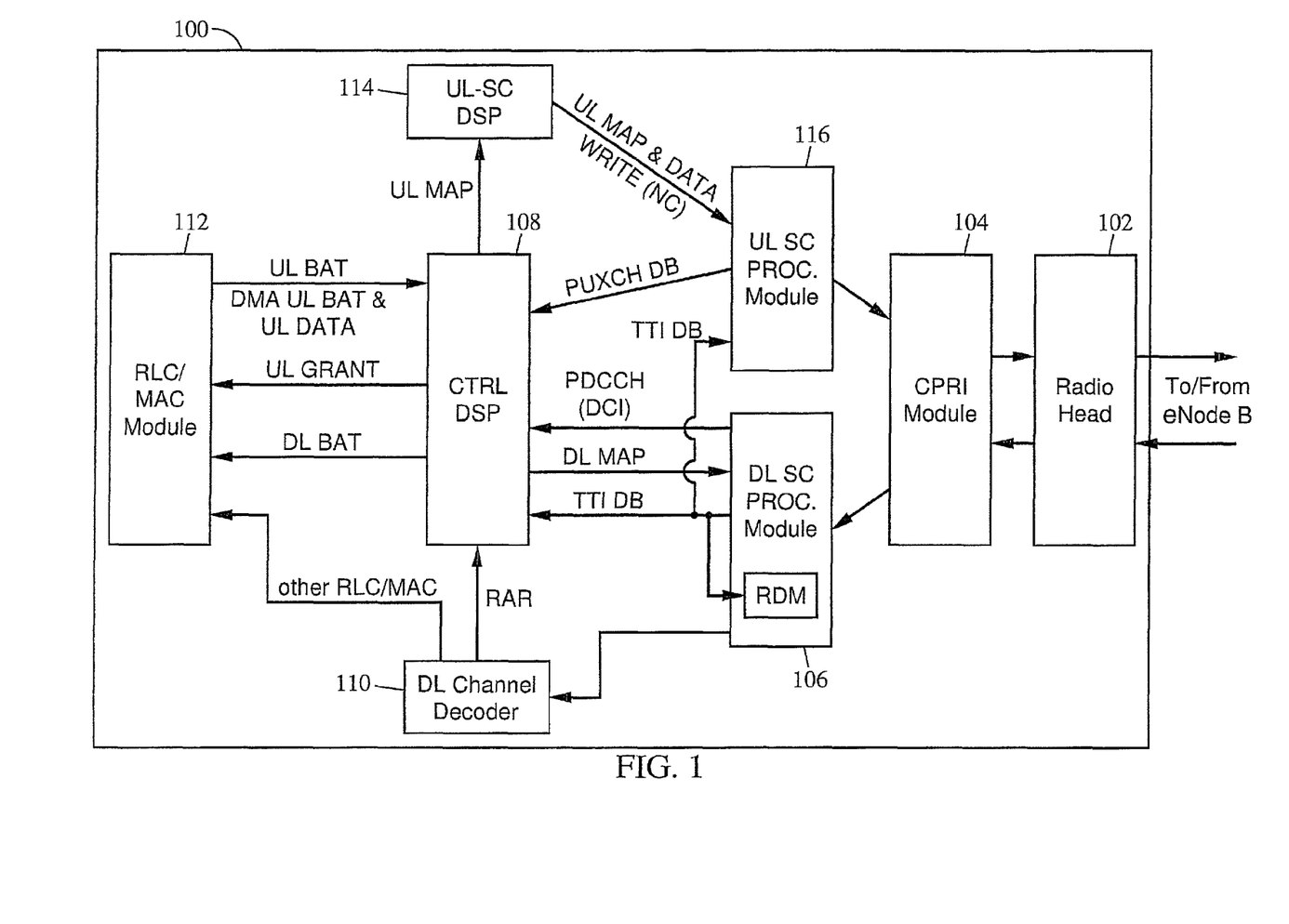
FIG. 1 is a block diagram illustrating an exemplary LTE multi-UE traffic simulator for dynamically controlling a Turbo decoding process in an LTE multi-UE traffic simulator in accordance with embodiments of the subject matter described herein.

Methods, traffic simulators, and computer readable media for dynamically controlling a Turbo decoding process in an LTE multi-UE traffic simulator are provided. FIG. 1 is a block diagram illustrating an exemplary LTE multi-UE traffic simulator for dynamically controlling a Turbo decoding process in an LTE multi-UE traffic simulator in accordance with embodiments of the subject matter described herein. Referring to FIG. 1, LTE multi-UE traffic simulator 100 includes radio head 102 for sending data to and receiving data from an eNode B over a radio interface. Radio head 102 interfaces with common public radio interface (CPRI) module 104. CPRI module 104 receives the data in the downlink direction for further processing and sends data in the uplink direction to radio head 102. Radio head 102 may be internal to or external to LTE multi-UE traffic simulator 100. For example in one test scenario, radio head 102 may be omitted or bypassed, and CPRI module 104 may connect to a corresponding CPRI interface of an eNode B under test via a wired interface, such as an optical fiber interface.

Downlink signal chain processing module 106 receives downlink data and control information from CPRI module 104. Downlink signal chain processing module 106 forwards the received downlink control information to control DSP 108. Control DSP 108 processes the downlink control information to produce descriptors for subsequent routing of the data and to produce resource maps (i.e., frequency, modulation, data block size, etc.) for decoding the downlink data. Control DSP 108 provides the resource maps data to downlink signal chain processing module 106. Control DSP 108 also performs some MAC layer processing, as will be described in detail below. Downlink signal chain processing module 106 sends the downlink data to downlink channel decoder 110. Downlink channel decoder 110 decodes the downlink data using a specified algorithm, such as Turbo decoding.

As illustrated in FIG. 1, downlink signal chain processing module 106 sends the physical downlink control channel (PDCCH) data to control DSP 108. PDCCH is the physical channel that carries downlink control information from the eNode B to the UE. The control information includes the downlink control information (DCI), which is used to decode the physical downlink shared channel (PDSCH) data. The PDSCH data is passed from CPRI module 104 to downlink signal chain processing module 106. Downlink signal chain processing module 106 performs processing of the PDSCH data and forwards the data to downlink channel decoder 110. The PDSCH channel is shared by plural users. The PDSCH channel also carries different types of data, including user-specific data, system information (cell specific—common to all users), paging data, and random access response (RAR) data.

On the uplink side, uplink signal chain DSP 114 receives uplink mapping data generated from uplink grant information from control DSP 108 and receives uplink data from RLC/MAC layer module 112. Uplink signal chain DSP 108 provides the uplink data to uplink signal chain processing module 116. Control DSP 108 also provides a resource mapping (i.e., frequencies, modulation, etc. to uplink signal chain processing module 116, which uses the mappings to formulate uplink modulated signal using transport block data received from MAC/RLC layer module 112. Uplink signal chain processing module 116 sends the uplink modulated signal to CPRI module 104, which sends the transport blocks to radio head 102 for transmission to the eNode B over an LTE wireless link. Alternatively, as set forth above, in some test implementations, radio head 102 can be bypassed or omitted, and CPRI module 104 sends the data to the eNodeB under test over a wired interface.

As indicated above, downlink channel decoder 110 may decode downlink data using a specified algorithm, such as Turbo decoding. LTE employs Turbo decoding for data transmissions on shared physical channels. Turbo decoding is an iterative process that decodes data while correcting erroneous bits. An iterative process, performance increases as the number of Turbo decoding iterations increases. As Turbo decoding is often hardware and/or software resource intensive, increasing the number of Turbo decoding iterations also increases the time required for processing. In an LTE multi-UE traffic simulator, one design challenge is to meet the real-time processing requirements for each simulated UE; a challenge which is exacerbated as the number of UEs being simulated increases. Turbo decoding being only one of several processes that must be completed within a limited time frame, a maximum number of Turbo decoding iterations is a system design parameter. A maximum number of Turbo decoding iterations that represents a compromise between quality and time may be chosen and hardcoded. Hardcoding the maximum number of Turbo decoding iterations, however, is associated with tradeoffs. Setting the value too large will result in correcting more erroneous packets, but may violate time constraints. Setting the value too small will allow more blocks to be processed within the time constraints (i.e., greater throughput and more possible simulated UEs), but will limit error correction.

For example, an overall system time budget may be specified for an LTE multi-UE traffic simulator, of which only one millisecond is allocated for rate-de-matching (RDM) and Turbo decoding. Thus the LTE multi-UE traffic simulator may be required to complete Turbo decoding for any possible case within the allocated millisecond. For example, some of the worst cases include: one UE with a modulation coding scheme 28 (MCS28) with two codewords using all one hundred resource blocks; one hundred UEs with MSC28 sharing all hundred resource blocks with two codewords; and a combination of UEs with different allocations utilizing the maximum number of resource blocks. In addition to the allocation, higher code rate and/or erroneous packet data units (PDUs) may directly impact an LTE multi-UE traffic simulator Turbo decoder's performance. The Turbo decoder's performance in these cases depends on the number of iterations it runs. For example, in one of the worst cases, the processing time exceeds the allocated one millisecond with four Turbo decoding iterations, resulting in the loss of all UEs and PDUs.

In accordance with embodiments of the subject matter described herein, the Turbo decoding process in an LTE multi-UE traffic simulator may be dynamically controlled. By dynamically controlling the Turbo decoding process, the subject matter described herein optimizes the usage of decoding resources, subject to finishing decoding for all the UEs within the time limit.

Figure 2:
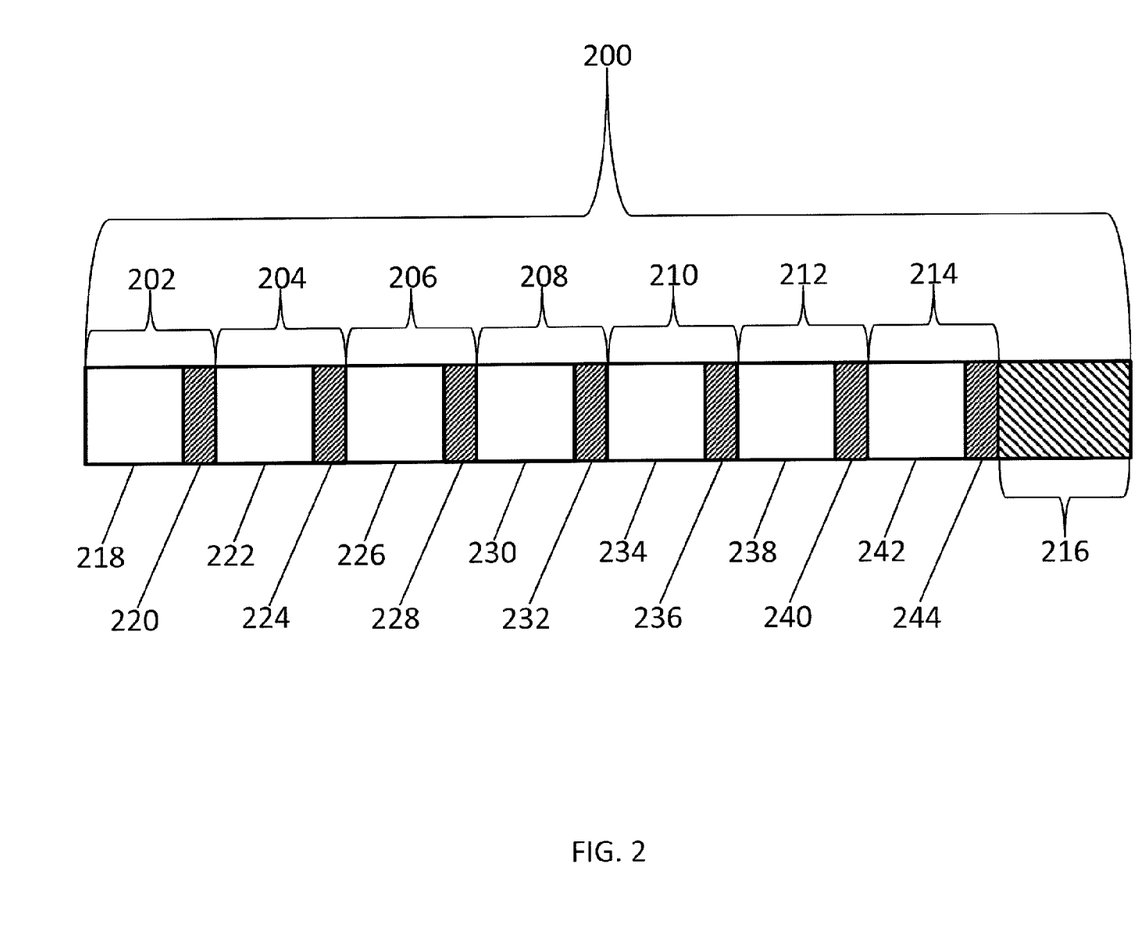
FIG. 2 is a block diagram illustrating an exemplary transport block.

FIG. 2 is a block diagram illustrating an exemplary transport block. Referring to FIG. 2, transport block 200 may include one or more code blocks. For example, transport block 200 includes code blocks 202, 204, 206, 208, 210, 212, and 214. Transport block 200 may also include a CRC code portion containing a CRC code value that corresponds to the data contained within transport block 200. For example, transport block 200 includes CRC code portion 216. Each of the code blocks contained within transport block 200 may include a data portion and a CRC code portion corresponding to the data contained within the data portion. For example, code block 202 may include data portion 218 and CRC code portion 220. Similarly, code block 204 may include data portion 222 and CRC code portion 224, code block 206 may include data portion 226 and CRC code portion 228, code block 208 may include data portion 230 and CRC code portion 232, code block 210 may include data portion 234 and CRC code portion 236, code block 212 may include data portion 238 and CRC code portion 240, and code block 214 may include data portion 242 and CRC code portion 244.

As will be described in greater detail below, a Turbo decoder, such as DL channel decoder 110 may perform one or more Turbo decoding iterations on a transport block, such as transport block 200. Specifically, a Turbo decoder, such as DL channel decoder 110 may decode a transport block by individually decoding each of its component code blocks, such as code blocks 202, 204, 206, 208, 210, 212, and 214. As discussed above, the number of Turbo decoding iterations required to decode a transport block may vary based on the number of errors contained within the transport block and/or the transport block's code rate. Upon completion of each Turbo decoding iteration, a Turbo decoder, such as DL channel decoder 110 may verify that a transport block and/or one or more of its component code blocks has been successfully decoded by comparing the decoded data against the transport block's CRC code portion (e.g., CRC code portion 216) and/or its component code block's CRC code portion(s) (e.g., CRC code portions 220, 224, 228, 232, 236, 240, and 244). If the CRC code portion is successfully verified, no additional Turbo decoding iterations are required. If, however, the CRC code portion indicates that the data has not been successfully decoded, one or more additional Turbo decoding iterations may be performed on the data.

As indicated above, in a multi-UE traffic simulator, one design challenge is that transport blocks must be decoded for multiple UEs being simulated within a single transmission time interval (TTI). If a Turbo decoder, such as DL channel decoder 110, were configured to perform Turbo decoding iterations until the CRC code portion was successfully verified, too much time may be consumed decoding transport blocks which are decoded first to decode all of the transport blocks and any remaining transport blocks may be lost. One approach, is to preconfigure or "hardcode" the multi-UE traffic simulator with a maximum number of Turbo decoding iterations to perform on each transport block. Such an approach, however, has significant limitations. If the number chosen is too high, the system may fail to decode each of the transport blocks. If the number chosen is too low, many of the transport blocks may fail to be successfully decoded. As will be explained in greater detail below, in accordance with embodiments of the subject matter described herein, the Turbo decoding process in an LTE multi-UE traffic simulator may be dynamically controlled. For example, in some embodiments, control DSP 108 may be configured to dynamically determine a maximum number of Turbo decoding iterations for each of a plurality of transport blocks received from an evolved NodeB under test. A Turbo decoder, such as DL channel decoder 110, may be configured to decode each of the received transport blocks for no more than its determined maximum number of Turbo decoding iterations.

Figure 3:
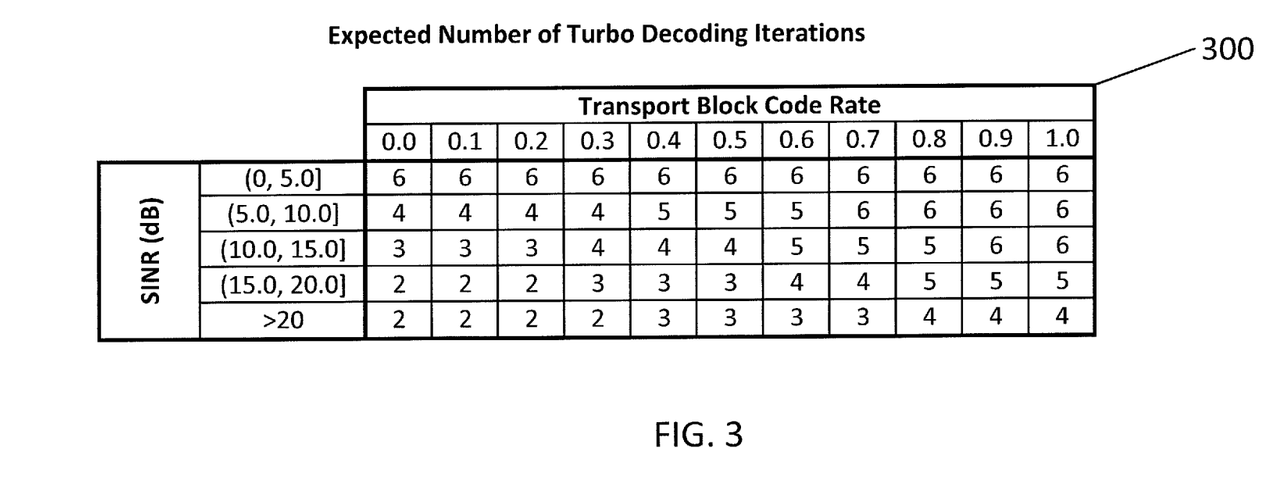
FIG. 3 is an exemplary table illustrating an expected number of Turbo decoding iterations for various channel conditions and code rates for dynamically controlling a Turbo decoding process in an LTE multi-UE traffic simulator in accordance with embodiments of the subject matter described herein.

In some embodiments, multi-UE traffic simulator 100 may be configured to determine an expected number of Turbo decoding iterations for a given transport block. For example, an expected number of Turbo decoding iterations for a given transport block may be determined based on its code rate and/or an associated channel condition. FIG. 3 is an exemplary table illustrating an expected number of Turbo decoding iterations for various channel conditions and code rates for dynamically controlling a Turbo decoding process in an LTE multi-UE traffic simulator in accordance with embodiments of the subject matter described herein. Referring to FIG. 3, table 300 may include one or more columns specifying various possible code rates for transport blocks. For example, table 300 includes columns corresponding to 0.0, 0.1, 0.2, 0.3, 0.4, 0.5, 0.6, 0.7, 0.8, 0.9, and 1.0 code rates. Table 300 may also include one or more rows specifying various possible channel conditions, such as ranges of signal to interference plus noise ratios (SINRs). For example, table 300 includes rows corresponding to an SINR greater than 0.0 dB and less than or equal to 5.0 dB, an SINR greater than 5.0 dB and less than or equal to 10.0 dB, an SINR greater than 10.0 dB and less than or equal to 15.0 dB, an SINR greater than 15.0 dB and less than or equal to 20.0 dB, and an SINR greater than 20.0 dB. Table 300 may further include one or more entries specifying an expected number of Turbo decoding iterations for a transport block based on an associated channel condition and code rate. For example, table 300 includes an entry specifying 6 Turbo decoding iterations are expected for a transport block having a code rate of 0.0 and a 3.0 dB SINR. Similarly, table 300 includes an entry specifying that 4 Turbo decoding iterations are expected for a transport block having a code rate of 1.0 and a 22.0 dB SINR. As will be explained in greater detail below, the expected number of Turbo decoding iterations required for a given transport block may be utilized in dynamically controlling a Turbo decoding process in an LTE multi-UE traffic simulator in accordance with embodiments of the subject matter described herein. It will be appreciated that table 300 is only one exemplary representation of information that may be utilized to determine an expected number of Turbo decoding iterations for a given transport block in accordance with embodiments of the subject matter described herein.

Figure 4:
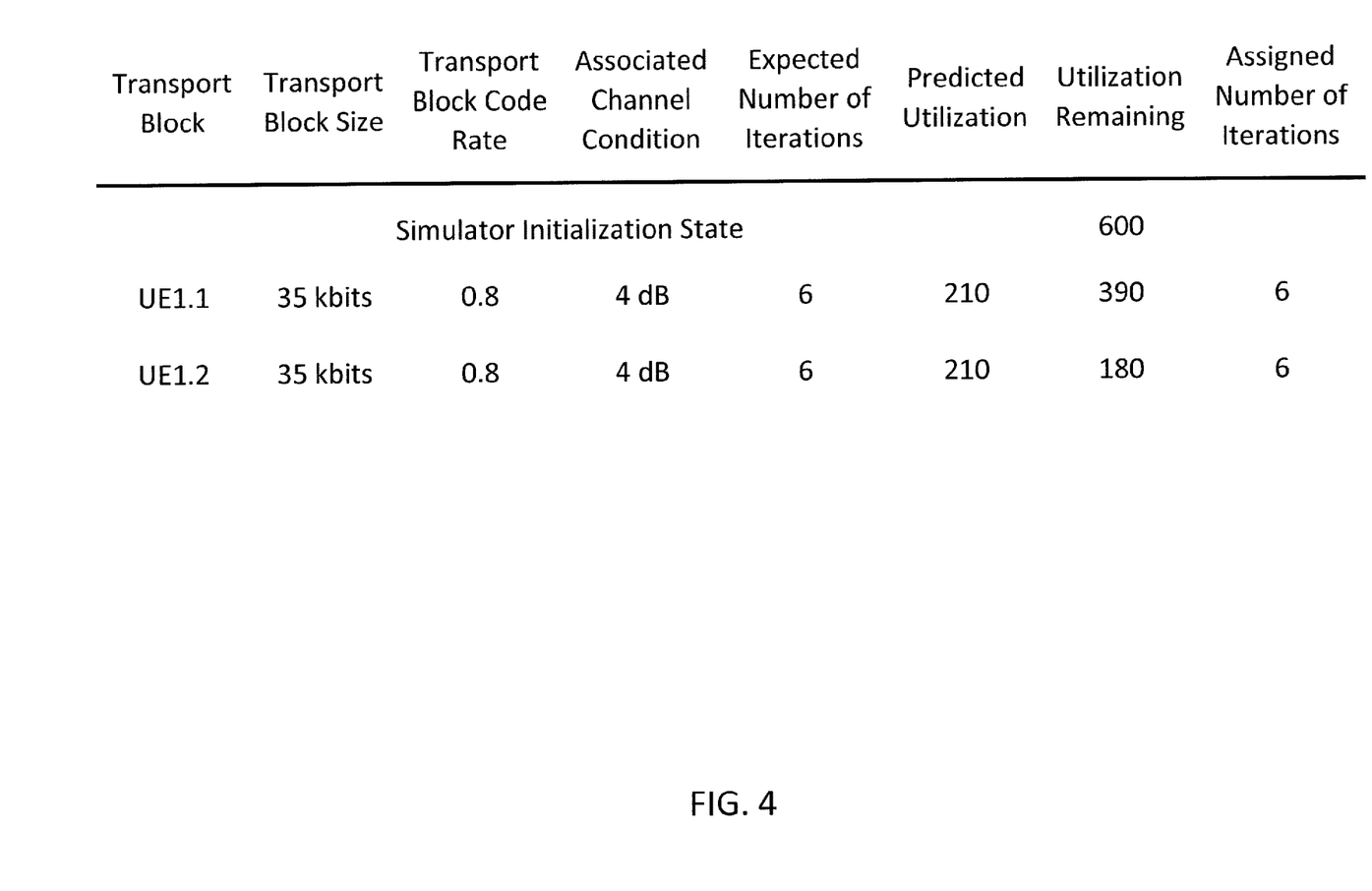
FIG. 4 illustrates an exemplary scenario in which a Turbo decoding process is dynamically controlled in an LTE multi-UE traffic simulator in accordance with embodiments of the subject matter described herein.

FIG. 4 illustrates an exemplary scenario in which a Turbo decoding process is dynamically controlled in an LTE multi-UE traffic simulator in accordance with embodiments of the subject matter described herein. Referring to FIG. 4, two transport blocks (e.g., UE1.1 and UE1.2) associated with a UE (e.g., UE1) may be received during a TTI. As described above control DSP 108 may be configured to determine for each of the transport blocks an expected number of Turbo decoding iterations. For example, control DSP 108 may reference a table similar to that illustrated in FIG. 3 to determine an expected number of Turbo decoding iterations for each of the transport blocks based on its code rate and/or associated channel condition. Returning to FIG. 4, transport block UE1.1 may be 35 kbits, associated with a 4 dB SINR channel condition, and have a 0.8 code rate, and control DSP 108 may accordingly determine that 6 Turbo decoding iterations are expected for transport block UE1.1. Similarly, transport block UE1.2 may be 35 kbits, associated with a 4 dB SINR channel condition, and have a 0.8 code rate, and control DSP 108 may accordingly determine that 6 Turbo decoding iterations are expected for transport block UE1.2.

Multi-UE traffic simulator 100 may be initialized with a maximum resource utilization budget, which may be a function of the maximum amount of data that may be received during a TTI and an average number of expected Turbo decoding iterations (e.g., 150 kbits times 4 expected Turbo decoding iterations equals 600). Control DSP 108 may calculate a total expected resource utilization based on the expected number of Turbo decoding iterations for each of the transport blocks. In some embodiments, the expected resource utilization for a transport block may be calculated by multiplying the size of the transport block by its expected number of Turbo decoding iterations. For example, control DSP 108 may calculate that UE1.1 is expected to utilize 210 resource units based on its size and expected number of Turbo decoding iterations (i.e., 35 times 6 equals 210). Similarly, control DSP 108 may calculate that UE1.2 is expected to utilize 210 resource units based on its size and expected number of Turbo decoding iterations (i.e., 35 times 6 equals 210). After calculating the expected resource utilization for each transport block, the total expected resource utilization may be updated or the maximum resource utilization budget for the multi-UE traffic simulator adjusted to reflect the additional resource demands associated with the transport block. For example, after calculating that UE1.1 is expected to utilize 210 resource units, the maximum resource utilization budget for multi-UE traffic simulator 100 may be adjusted to reflect that 390 units remain. Similarly, after calculating that UE1.2 is expected to utilize 210 resource units, the maximum resource utilization budget for multi-UE traffic simulator 100 may be adjusted to reflect that 180 units remain.

After multi-UE traffic simulator 100's resource budget has been adjusted to reflect each of the transport blocks that must be decoded, control DSP 108 may determine whether the total expected resource utilization (here, 420 units) exceeds the maximum specified resource utilization for multi-UE traffic simulator 100 (e.g., 600 units). In response to determining that the total expected resource utilization exceeds the maximum specified resource utilization for multi-UE traffic simulator 100, control DSP 108 may assign a maximum number of Turbo decoding iterations to each of transport blocks UE1.1 and UE1.2 in proportion to its expected number of Turbo decoding iterations. In this example, however, 180 resource units remain and each of transport blocks UE1.1 and UE1.2 is assigned its full expected number of Turbo decoding iterations (e.g., UE1.1 is assigned 6 Turbo decoding iterations and UE1.2 is assigned 6 Turbo decoding iterations). Channel decoder 110 may then perform Turbo decoding for each of transport blocks UE1.1 and UE1.2 for no more than their respective determined maximum number of Turbo decoding iterations (e.g., 6 and 6).

Figure 5:
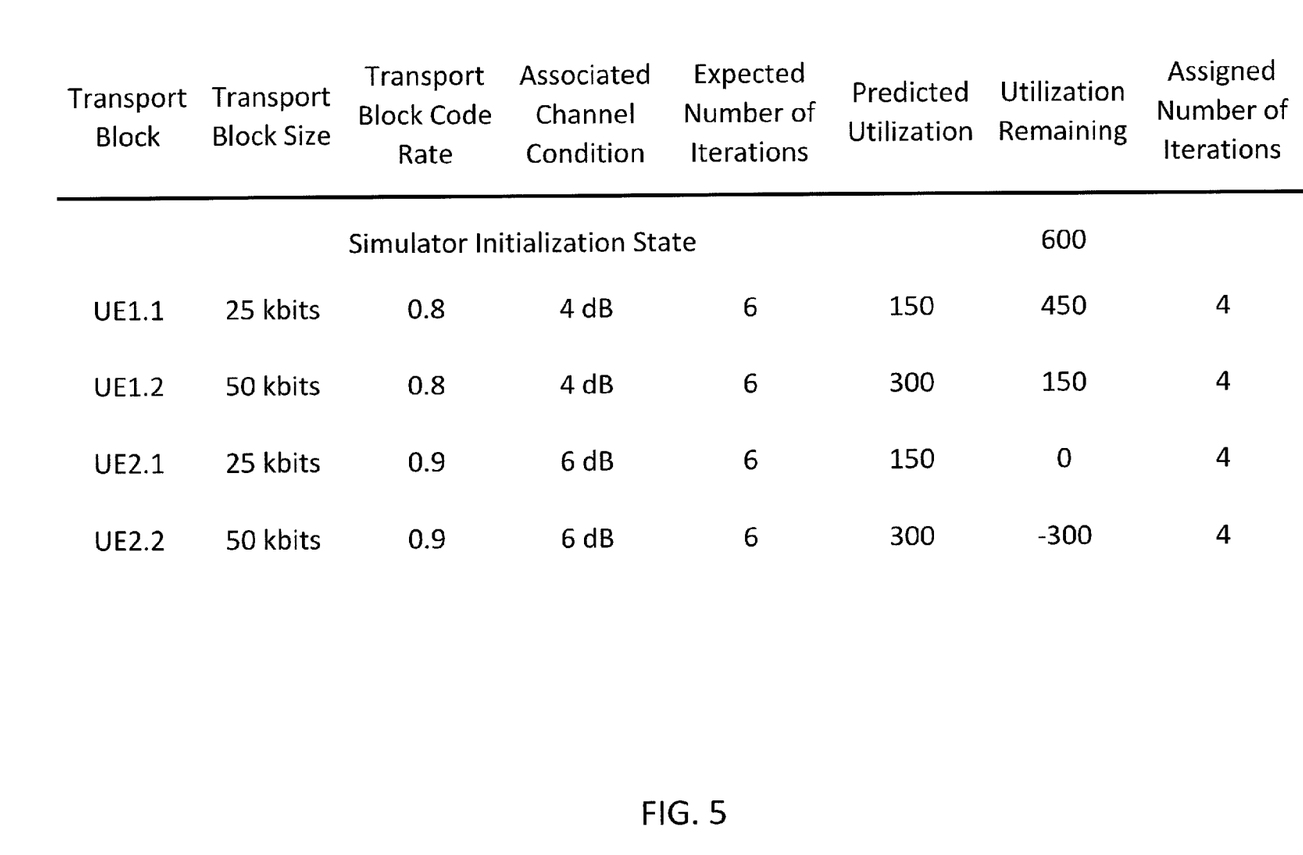
FIG. 5 illustrates a second exemplary scenario in which a Turbo decoding process is dynamically controlled in an LTE multi-UE traffic simulator in accordance with embodiments of the subject matter described herein.

FIG. 5 illustrates a second exemplary scenario in which a Turbo decoding process is dynamically controlled in an LTE multi-UE traffic simulator in accordance with embodiments of the subject matter described herein. Referring to FIG. 5, two transport blocks (e.g., UE1.1 and UE1.2) associated with a first UE (e.g., UE1) and two transport blocks (e.g., UE2.1 and UE2.2) associated with a second UE (e.g., UE2) may be received during a TTI. As described above control DSP 108 may be configured to determine for each of the transport blocks an expected number of Turbo decoding iterations. For example, control DSP 108 may reference a table similar to that illustrated in FIG. 3 to determine an expected number of Turbo decoding iterations for each of the transport blocks based on its code rate and/or an associated channel condition. Returning to FIG. 5, transport block UE1.1 may be 25 kbits, associated with a 4 dB SINR channel condition, and have a 0.8 code rate, and control DSP 108 may accordingly determine that 6 Turbo decoding iterations are expected for transport block UE1.1. Similarly, transport block UE1.2 may be 50 kbits, associated with a 4 dB SINR channel condition, and have a 0.8 code rate, and control DSP 108 may accordingly determine that 6 Turbo decoding iterations are expected for transport block UE1.2; transport block UE2.1 may be 25 kbits, associated with a 6 dB SINR channel condition, and have a 0.9 code rate, and control DSP 108 may accordingly determine that 6 Turbo decoding iterations are expected for transport block UE2.1; and transport block UE2.2 may be 50 kbits, associated with a 6 dB SINR channel condition and have a 0.9 code rate, and control DSP 108 may accordingly determine that 6 Turbo decoding iterations are expected for transport block UE2.2.

Multi-UE traffic simulator 100 may be initialized with a maximum resource utilization budget, which may be a function of the maximum amount of data that may be received during a TTI and an average number of expected Turbo decoding iterations (e.g., 150 kbits times 4 expected Turbo decoding iterations equals 600). Control DSP 108 may calculate a total expected resource utilization based on the expected number of Turbo decoding iterations for each of the transport blocks. In some embodiments, the expected resource utilization for a transport block may be calculated by multiplying the size of the transport block by its expected number of Turbo decoding iterations. For example, control DSP 108 may calculate that UE1.1 is expected to utilize 150 resource units based on its size and expected number of Turbo decoding iterations (i.e., 25 times 6 equals 150). Similarly, control DSP 108 may calculate that UE1.2 is expected to utilize 300 resource units based on its size and expected number of Turbo decoding iterations (i.e., 50 times 6 equals 300); control DSP 108 may calculate that UE2.1 is expected to utilize 150 resource units based on its size and expected number of Turbo decoding iterations (i.e., 25 times 6 equals 150); and control DSP 108 may calculate that UE2.2 is expected to utilize 300 resource units based on its size and expected number of Turbo decoding iterations (i.e., 50 times 6 equals 300). After calculating the expected resource utilization for each transport block, the total expected resource utilization may be updated or the maximum resource utilization budget for the multi-UE traffic simulator adjusted to reflect the additional resource demands associated with the transport block. For example, after calculating that UE1.1 is expected to utilize 150 resource units, the maximum resource utilization budget for multi-UE traffic simulator 100 may be adjusted to reflect that 450 units remain. Similarly, after calculating that UE1.2 is expected to utilize 300 resource units, the maximum resource utilization budget for multi-UE traffic simulator 100 may be adjusted to reflect that 150 units remain; after calculating that UE2.1 is expected to utilize 150 resource units, the maximum resource utilization budget for multi-UE traffic simulator 100 may be adjusted to reflect that total expected resource utilization budget has been met; and after calculating that UE2.2 is expected to utilize 300 resource units, the maximum resource utilization budget for multi-UE traffic simulator 100 may be adjusted to reflect that total expected resource utilization exceeds the maximum resource utilization budget by 300 units.

After multi-UE traffic simulator 100's resource budget has been adjusted to reflect each of the transport blocks that must be decoded, control DSP 108 may determine whether the total expected resource utilization (here, 900 units) exceeds the maximum specified resource utilization for multi-UE traffic simulator 100 (e.g., 600 units). In response to determining that the total expected resource utilization exceeds the maximum specified resource utilization for multi-UE traffic simulator 100, control DSP 108 may assign a maximum number of Turbo decoding iterations to each of transport blocks UE1.1, UE1.2, UE2.1, and UE2.2 in proportion to its expected number of Turbo decoding iterations. Here, for example, control DSP 108 may assign UE1.1 a maximum number of 4 Turbo decoding iterations (i.e., its 6 expected Turbo decoding iterations reduced by the proportion by which multi-UE traffic simulator 100 is over budgeted or, here, one-third). Similarly, control DSP 108 may assign UE1.2 a maximum number of 4 Turbo decoding iterations (i.e., its 6 expected Turbo decoding iterations reduced by the proportion by which multi-UE traffic simulator 100 is over budgeted or, here, one-third); control DSP 108 may assign UE2.1 a maximum number of 4 Turbo decoding iterations (i.e., its 6 expected Turbo decoding iterations reduced by the proportion by which multi-UE traffic simulator 100 is over budgeted or, here, one-third); and control DSP 108 may assign UE2.2 a maximum number of 4 Turbo decoding iterations (i.e., its 6 expected Turbo decoding iterations reduced by the proportion by which multi-UE traffic simulator 100 is over budgeted or, here, one-third). Channel decoder 110 may then perform Turbo decoding for each of transport blocks UE1.1, UE1.2, UE2.1, and UE2.2 for no more than their respective determined maximum number of Turbo Decoding iterations (e.g., 4, 4, 4, and 4).

In the foregoing examples multi-UE traffic simulator 100 dynamically controlled its Turbo decoding process with knowledge of each of the transport blocks that it was required to decode for the TTI. In certain scenarios, however, multi-UE traffic simulator 100 may be required to determine a maximum number of Turbo decoding iterations for each transport block without knowing details (e.g., size and/or code rate information) associated with additional transport blocks that may need to be subsequently decoded within the TTI. In such scenarios, multi-UE traffic simulator 100 may be configured to dynamically control its Turbo decoding process as transport block descriptors are built.

Figure 6:
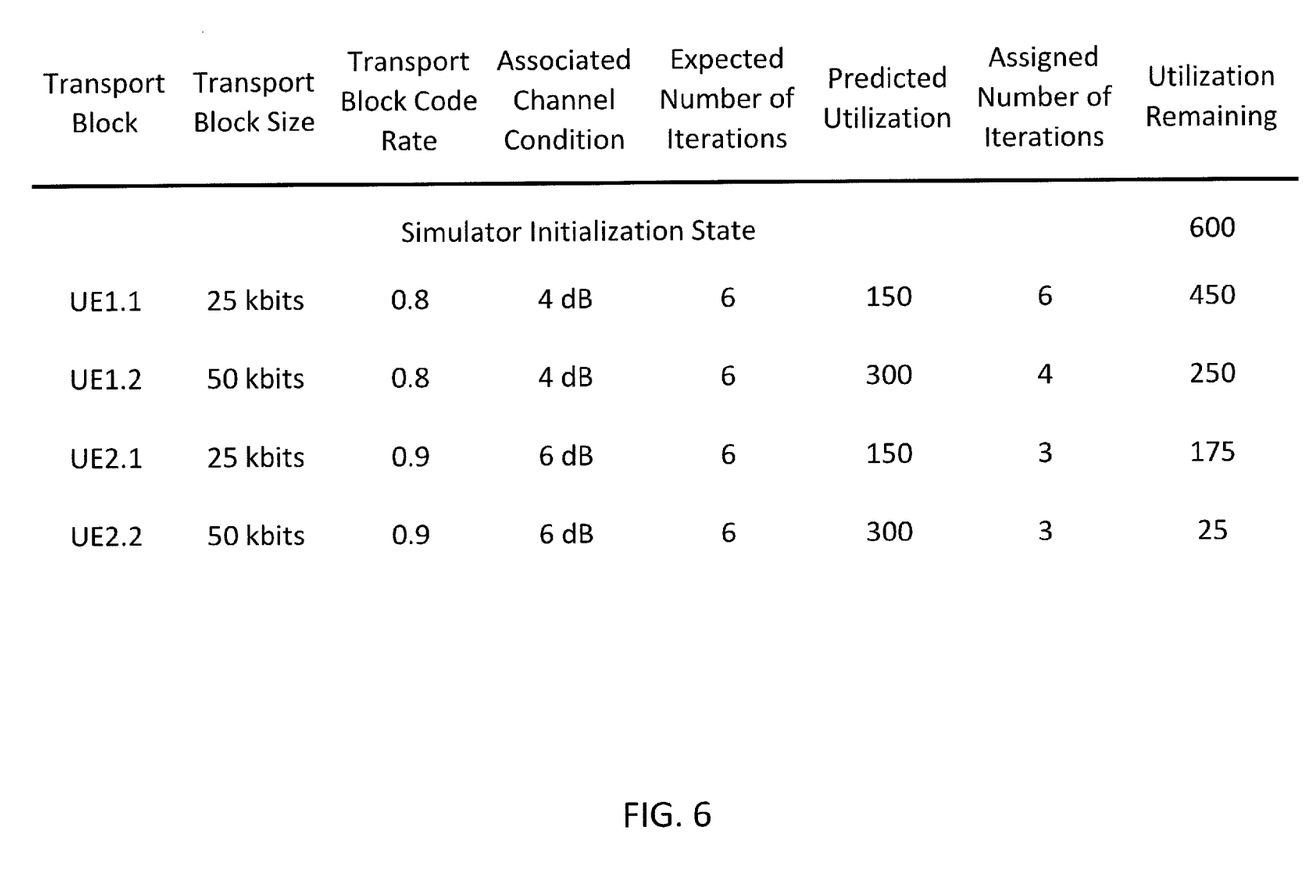
FIG. 6 illustrates an exemplary scenario in which a Turbo decoding process is dynamically controlled in an LTE multi-UE traffic simulator as transport block descriptors are built in accordance with embodiments of the subject matter described herein.

FIG. 6 illustrates an exemplary scenario in which a Turbo decoding process is dynamically controlled in an LTE multi-UE traffic simulator as transport block descriptors are built in accordance with embodiments of the subject matter described herein. Referring to FIG. 6, two transport blocks (e.g., UE1.1 and UE1.2) associated with a first UE (e.g., UE1) and two transport blocks (e.g., UE2.1 and UE2.2) associated with a second UE (e.g., UE2) may be received during a TTI. Control DSP 108 may be configured to build a transport block descriptor for each of transport blocks UE1.1, UE1.2, UE2.1, and UE2.2 as it is processed by multi-UE traffic simulator 100. While building transport block descriptors for each of transport blocks UE1.1, UE1.2, UE2.1, and UE2.2, control DSP 108 may be configured to assign an expected number of Turbo decoding iterations to each transport block based on its code rate and/or an associated channel condition. For example, as control DSP 108 builds a transport block descriptor for transport block UE1.1, control DSP 108 may utilize a table like that illustrated in FIG. 3 to assign 6 expected Turbo decoding iterations to transport block UE1.1. Control DSP 108 may also be configured to maintain a current total of expected resource utilization based on the number of Turbo decoding iterations assigned. For example, after assigning 6 expected Turbo decoding iterations to transport block UE1.1, control DSP 108 may update its available utilization remaining to reflect the assignment of 6 expected Turbo decoding iterations to transport block UE1.1 (e.g., reduce the initial 600 utilization units to 450 utilization units). Control DSP 108 may further be configured to determine whether the current total of expected resource utilization has reached a predetermined portion of a specified maximum resource utilization for multi-UE traffic simulator 100. For example, a predetermined portion of the specified maximum resource utilization may be configured to be half the initial 600 units (i.e., 300 units).

In response to determining that the current total of expected resource utilization has reached the predetermined portion of the specified maximum resource utilization for multi-UE traffic simulator 100, control DSP 108 may be configured to assign a reduced portion of an expected number of Turbo decoding iterations to each remaining transport block based. For example, when control DSP 108 builds a transport block descriptor for transport block UE1.2, it may determine that 6 Turbo decoding iterations are expected to be required, but because half of the specified maximum resource utilization units will have been assigned, it may assign two-thirds of the 6 expected Turbo decoding iterations (i.e., 4) to transport block UE1.2. Control DSP 108 may then update the current total of utilization units remaining to reflect the assignment of 4 Turbo decoding iterations to transport block UE1.2 (i.e., it may reduce the 450 units remaining by the 200 units assigned to transport block UE1.2). Similarly, when control DSP 108 builds a transport block descriptor for transport block UE2.1, it may determine that 6 Turbo decoding iterations are expected to be required, but because two-thirds of the specified maximum resource utilization will be assigned, it may assign half of the 6 expected Turbo decoding iterations (i.e., 3) to transport block UE2.1. Control DSP 108 may then update the current total of utilization units remaining to reflect the assignment of 3 Turbo decoding iterations to transport block UE2.1 (i.e., it may reduce the 250 units remaining by the 75 units assigned to transport block UE1.2). Similarly, when control DSP 108 builds a transport block descriptor for transport block UE2.2, it may determine that 6 Turbo decoding iterations are expected to be required, but because two-thirds of the specified maximum resource utilization units have already been assigned, it may assign half of the 6 expected Turbo decoding iterations (i.e., 3) to transport block UE2.2. Control DSP may then update the current total of utilization units remaining to reflect the assignment of 3 Turbo decoding iteration to transport block UE2.2 (i.e., it may reduce the 175 units remaining by the 150 units assigned to transport block UE2.2). Thus, as the current total of utilization resource units remaining represent a smaller portion of the specified maximum number of resource utilization units for multi-UE traffic simulator 100, control DSP 108 assigns a smaller portion of the expected number of Turbo decoding iterations to each remaining transport block, preserving resource utilization units for any remaining transport blocks.

The foregoing examples illustrate approaches for calculating a maximum number of Turbo decoding iterations for each of a plurality of transport blocks that require decoding within a TTI. Any particular transport block, however, may require fewer Turbo decoding iterations than are assigned to it to be successfully decoded. For example, a table similar to table 300 illustrated in FIG. 3 may specify that a transport block associated with a 4 dB SINR channel condition having a 0.6 code rate may be expected to require 6 Turbo decoding iterations. Upon actually being decoded, however, the CRC code portion of such a transport block may verify that it has been successfully decoded after only 3 Turbo decoding iterations, i.e., the remaining 3 Turbo decoding iterations that were expected to be required for the transport block are not utilized. In accordance with embodiments of the subject matter described herein, multi-UE traffic simulator 100 may be configured to allocate such unused Turbo decoding iterations to other transport blocks that must be decoded within the TTI.

Figure 7:
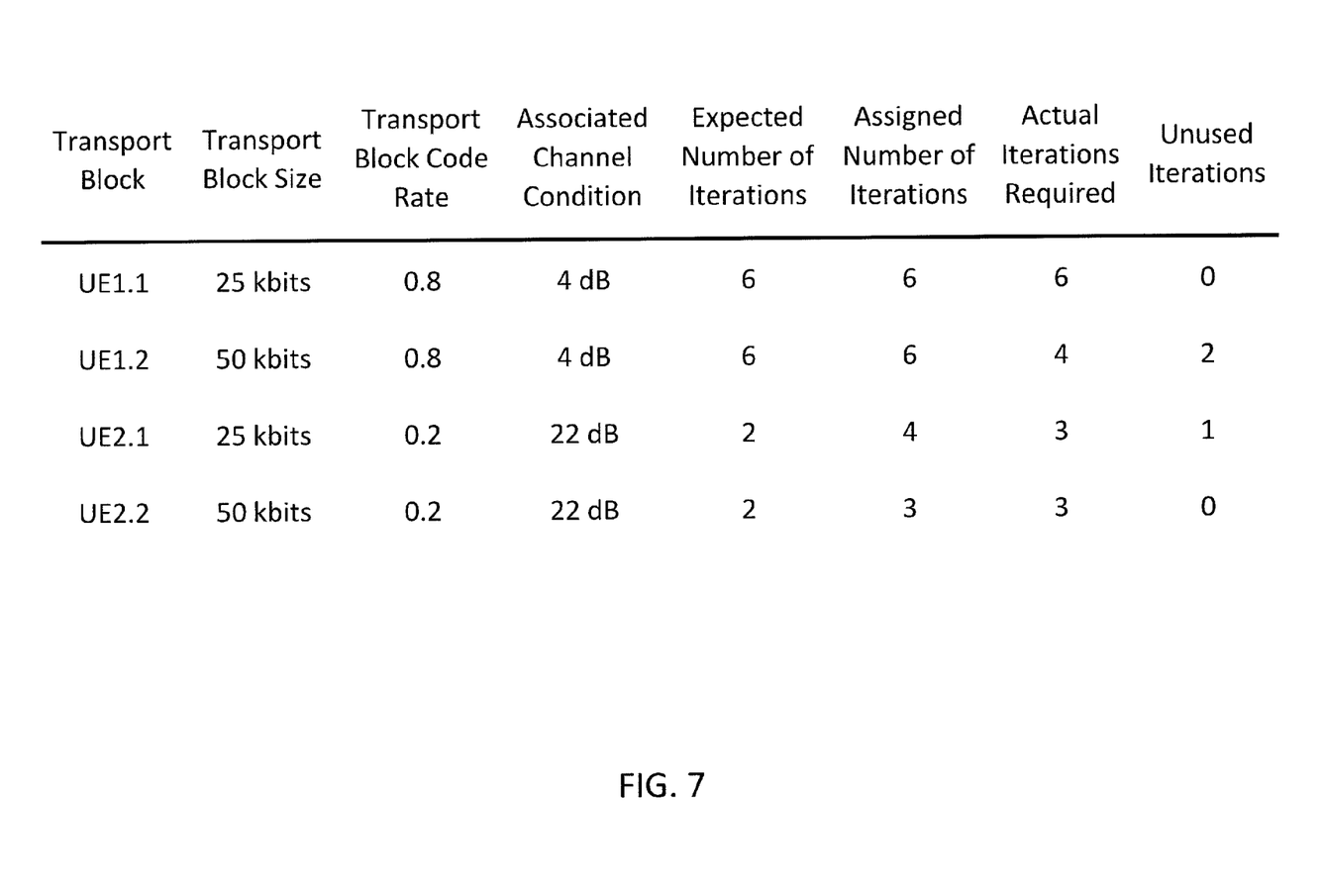
FIG. 7 illustrates an exemplary scenario in which a Turbo decoding process is dynamically controlled in an LTE multi-UE traffic simulator and unused Turbo decoding iterations are allocated to remaining transport blocks in accordance with embodiments of the subject matter described herein.

FIG. 7 illustrates an exemplary scenario in which a Turbo decoding process is dynamically controlled in an LTE multi-UE traffic simulator and unused Turbo decoding iterations are allocated to remaining transport blocks in accordance with embodiments of the subject matter described herein. Referring to FIG. 7, two transport blocks (e.g., UE1.1 and UE1.2) associated with a first UE (e.g., UE1) and two transport blocks (e.g., UE2.1 and UE2.2) associated with a second UE (e.g., UE2) may be received during a TTI. Utilizing a table similar to table 300 illustrated in FIG. 3, control DSP 108 may determine that transport block UE1.1 is expected to require 6 Turbo decoding iterations. Upon decoding transport block UE1.1 channel decoder 110 may determine that all 6 Turbo decoding iterations are required to successfully decode transport block UE1.1 (e.g., only after all 6 Turbo decoding iterations may transport block UE1.1's CRC code portion be successfully verified). Similarly, control DSP 108 may determine that transport block UE1.2 is expected to require 6 Turbo decoding iterations. Upon decoding transport block UE1.2, channel decoder 110 may determine, however, that only 4 of the 6 expected Turbo decoding iterations are required to successfully decode transport block UE1.2 (e.g., after 4 Turbo decoding iterations, transport block UE1.2's CRC code portion may be successfully verified).

Control DSP 108 may then determine that transport block UE2.1 is expected to require 2 Turbo decoding iterations, but may allocate the additional unused 2 Turbo decoding iterations to transport block UE2.1 as well. Upon decoding transport block UE2.1, however, channel decoder 110 may determine that the 2 expected Turbo decoding iterations are not sufficient to successfully decode transport block UE2.1 (e.g., after 2 Turbo decoding iterations transport block UE2.1's CRC code portion may fail to be successfully verified). For example, transport block UE2.1 may contain an unusually large number of erroneous bits. Channel decoder 110 may, however, continue to perform up to the additional 2 unused Turbo decoding iterations on transport block UE2.1. After performing the third Turbo decoding iteration on transport block UE2.1, channel decoder 110 may determine that transport block UE2.1 has been successfully decoded (e.g., after 3 Turbo decoding iterations, transport block UE2.1's CRC code portion may be successfully verified). Control DSP 108 may then determine that transport block UE2.2 is expected to require 2 Turbo decoding iterations, but may allocate the additional unused 1 Turbo decoding iteration to transport block UE2.2 as well. Upon decoding transport block UE2.2, however, channel decoder 110 may determine that the 2 expected Turbo decoding iterations are not sufficient to successfully decode transport block UE2.2 (e.g., after 2 Turbo decoding iterations transport block UE2.2's CRC code portion may fail to be successfully verified). For example, transport block UE2.2 may contain an unusually large number of erroneous bits. Channel decoder 110 may, however, continue to perform up to the additional 1 unused Turbo decoding iteration on transport block UE2.2. After performing the unused Turbo decoding iteration on transport block UE2.2, channel decoder 110 may determine that transport block UE2.2 has been successfully decoded (e.g., after 3 Turbo decoding iterations, transport block UE2.2's CRC code portion may be successfully verified). Thus, the unused Turbo decoding iterations associated with transport block UE1.2 may be utilized to successfully decode transport blocks UE2.1 and UE2.2 despite their unusually large number of erroneous bits. It will be appreciated that the number of simulated UEs and/or the number of transport blocks requiring Turbo decoding may greatly exceed the numbers illustrated in the foregoing examples, which are limited in scale for the sake of clarity. For example, multi-UE traffic simulator 100 may be configured to simulate hundreds of UEs and required to Turbo decode hundreds of corresponding transport blocks.

Figure 8:
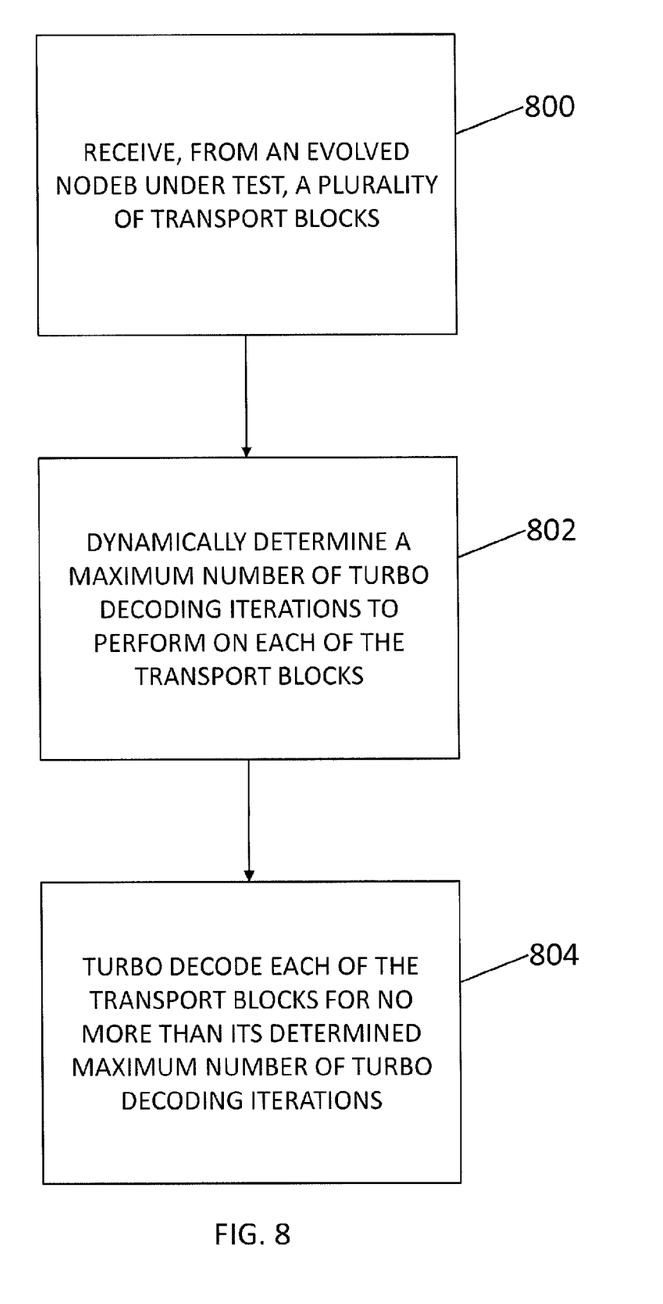
FIG. 8 is a flow chart illustrating an exemplary process for dynamically controlling a Turbo decoding process in an LTE multi-UE traffic simulator in accordance with embodiments of the subject matter described herein.

FIG. 8 is a flow chart illustrating an exemplary process for dynamically controlling a Turbo decoding process in an LTE multi-UE traffic simulator in accordance with embodiments of the subject matter described herein. Referring to FIG. 8, in step 800, a plurality of transport blocks is received from an evolved NodeB under test. For example, transport blocks UE1.1, UE1.2, UE2.1, and UE2.2 may be received from an evolved NodeB being tested by multi-UE traffic simulator 100. In step 802, a maximum number of Turbo decoding iterations to perform on each of the transport blocks is dynamically determined. For example, control DSP 108 may dynamically determine a maximum number of Turbo decoding iterations for each of transport blocks UE1.1, UE1.2, UE2.1, and UE2.2. In step 804, each of the transport blocks is Turbo decoded for no more than its determined maximum number of Turbo decoding iterations. For example, channel decoder 110 may Turbo decode each of transport blocks UE1.1, UE1.2, UE2.1, and UE2.2 for no more than it determined maximum number of Turbo decoding iterations.

It will be understood that various details of the subject matter described herein may be changed without departing from the scope of the subject matter described herein. Furthermore, the foregoing description is for the purpose of illustration only, and not for the purpose of limitation, as the subject matter described herein is defined by the claims as set forth hereinafter.

What is claimed is:

1. A method for dynamically controlling a Turbo decoding process in a long term evolution (LTE) multi-user equipment (UE) traffic simulator, the method comprising:
   in an LTE traffic simulator configured to simulate plural UE devices:
      receiving, from an evolved NodeB under test, a plurality of transport blocks;
      dynamically determining a maximum number of Turbo decoding iterations for each of the transport blocks using an expected number of Turbo decoding iterations determined for each of the transport blocks, wherein dynamically determining a maximum number of Turbo decoding iterations for each of the transport blocks includes maintaining a running count of available Turbo decoding iterations associated with the LTE traffic simulator during a Turbo decoding process and dynamically allocating the available Turbo decoding iterations to each of the transport blocks in proportion to the expected number of Turbo decoding iterations for each of the transport blocks; and
      Turbo decoding each of the transport blocks for no more than its determined maximum number of Turbo decoding iterations.

2. The method of claim 1 wherein dynamically determining the maximum number of Turbo decoding iterations for each of the transport blocks includes:
   determining, for each of the transport blocks, the expected number of Turbo decoding iterations;
   calculating a total expected resource utilization based on the expected number of Turbo decoding iterations for each of the transport blocks;
   determining whether the total expected resource utilization exceeds a specified maximum resource utilization for the multi-UE traffic simulator; and in response to determining that the total expected resource utilization exceeds the specified maximum resource utilization for the multi-UE traffic simulator, assigning a maximum number of Turbo decoding iterations to each of the transport blocks in proportion to its expected number of Turbo decoding iterations.

3. The method of claim 2 wherein the expected number of Turbo decoding iterations is determined based on at least one of a code rate associated with the transport block and a channel condition associated with the transport block.

4. A method for dynamically controlling a Turbo decoding process in a long term evolution (LTE) multi-user equipment (UE) traffic simulator, the method comprising:
in an LTE traffic simulator configured to simulate plural UE devices:
receiving, from an evolved NodeB under test, a plurality of transport blocks;
dynamically determining a maximum number of Turbo decoding iterations for each of the transport blocks; and
Turbo decoding each of the transport blocks for no more than its determined maximum number of Turbo decoding iterations, wherein dynamically determining the maximum number of Turbo decoding iterations for each of the transport blocks includes:
building a transport block descriptor for each of the transport blocks; and
while building each of the transport block descriptors:
assigning an expected number of Turbo decoding iterations to each transport block;
maintaining a current total of expected resource utilization based on the number of expected Turbo decoding iterations assigned;
determining whether the current total of expected resource utilization has reached a predetermined portion of a specified maximum resource utilization for the multi-UE traffic simulator; and
in response to determining that the current total of expected resource utilization has reached the predetermined portion of the specified maximum resource utilization for the multi-UE traffic simulator, assigning a reduced portion of an expected number of Turbo decoding iterations to each remaining transport block.

5. The method of claim 4 wherein the expected number of Turbo decoding iterations is assigned based on at least one of a code rate associated with the transport block and a channel condition associated with the transport block.

6. The method of claim 1 wherein dynamically determining the maximum number of Turbo decoding iterations for each of the transport blocks includes, while Turbo decoding each of the transport blocks, maintaining a total number of Turbo decoding iterations performed and allocating any unused Turbo decoding iterations to remaining transport blocks.

7. The method of claim 1 wherein each of the transport blocks comprises a plurality of code blocks and wherein Turbo decoding each of the transport blocks for no more than its determined maximum number of Turbo decoding iterations includes dynamically allocating the determined maximum number of Turbo decoding iterations for each transport block among its plurality of code blocks.

8. The method of claim 1 wherein at least two of the transport blocks are associated with distinct UEs simulated by the LTE traffic simulator.

9. The method of claim 1 wherein the transport blocks comprise LTE physical downlink shared channel (PDSCH) transport blocks.

10. A system for simulating plural user equipment (UE) devices and dynamically controlling a Turbo decoding process, the system comprising:
a long term evolution (LTE) multi-UE traffic simulator including:
a communication interface configured to receive, from an evolved NodeB under test, a plurality of transport blocks;
a digital signal processor (DSP) configured to dynamically determine a maximum number of Turbo decoding iterations for each of the transport blocks using an expected number of Turbo decoding iterations determined for each of the transport blocks, wherein dynamically determining a maximum number of Turbo decoding iterations for each of the transport blocks includes maintaining a running count of available Turbo decoding iterations associated with the LTE traffic simulator during a Turbo decoding process and dynamically allocating the available Turbo decoding iterations to each of the transport blocks in proportion to the expected number of Turbo decoding iterations for each of the transport blocks; and
a Turbo decoder configured to decode each of the transport blocks for no more than its determined maximum number of Turbo decoding iterations.

11. The system of claim 10 wherein the DSP is configured to:
determine, for each of the transport blocks, the expected number of Turbo decoding iterations;
calculate a total expected resource utilization based on the expected number of Turbo decoding iterations for each of the transport blocks;
determine whether the total expected resource utilization exceeds a specified maximum resource utilization for the multi-UE traffic simulator; and
in response to determining that the total expected resource utilization exceeds the specified maximum resource utilization for the multi-UE traffic simulator, assign a maximum number of Turbo decoding iterations to each of the transport blocks in proportion to its expected number of Turbo decoding iterations.

12. The system of claim 11 wherein the DSP is configured to determine the expected number of Turbo decoding iterations based on at least one of a code rate associated with the transport block and a channel condition associated with the transport block.

13. A system for simulating plural user equipment (UE) devices and dynamically controlling a Turbo decoding process, the system comprising:
a long term evolution (LTE) multi-UE traffic simulator including:
a communication interface configured to receive, from an evolved NodeB under test, a plurality of transport blocks;
a digital signal processor (DSP) configured to dynamically determine a maximum number of Turbo decoding iterations for each of the transport blocks; and
a Turbo decoder configured to decode each of the transport blocks for no more than its determined maximum number of Turbo decoding iterations,
wherein the DSP is configured to:
build a transport block descriptor for each of the transport blocks; and while building each of the transport block descriptors:
assign an expected number of Turbo decoding iterations to each transport block;
maintain a current total of expected resource utilization based on the number of expected Turbo decoding iterations assigned;
determine whether the current total of expected resource utilization has reached a predetermined portion of a specified maximum resource utilization for the multi-UE traffic simulator; and
in response to determining that the current total of expected resource utilization has reached the predetermined portion of the specified maximum resource utilization for the multi-UE traffic simulator, assign a reduced portion of an expected number of Turbo decoding iterations to each remaining transport block.

14. The system of claim 13 wherein the DSP is configured to assign the expected number of Turbo decoding iterations based on at least one of a code rate associated with the transport block and a channel condition associated with the transport block.

15. The system of claim 10 wherein the Turbo decoder is configured to, while Turbo decoding each of the transport blocks, maintain a total number of Turbo decoding iterations performed and allocate any unused Turbo decoding iterations to remaining transport blocks.

16. The system of claim 10 wherein each of the transport blocks comprises a plurality of code blocks and wherein the Turbo decoder is configured to dynamically allocate the determined maximum number of Turbo decoding iterations for each transport block among its plurality of code blocks.

17. The system of claim 10 wherein at least two of the transport blocks are associated with distinct UEs simulated by the LTE traffic simulator.

18. The system of claim 10 wherein the transport blocks comprise LTE physical downlink shared channel (PDSCH) transport blocks.

19. A non-transitory computer readable medium comprising computer executable instructions that when executed by a processor of a computer control the computer to perform steps comprising:
in a long term evolution (LTE) traffic simulator configured to simulate plural UE devices:
receiving, from an evolved NodeB under test, a plurality of transport blocks;
dynamically determining a maximum number of Turbo decoding iterations for each of the transport blocks using an expected number of Turbo decoding iterations determined for each of the transport blocks, wherein dynamically determining a maximum number of Turbo decoding iterations for each of the transport blocks includes maintaining a running count of available Turbo decoding iterations associated with the LTE traffic simulator during a Turbo decoding process and dynamically allocating the available Turbo decoding iterations to each of the transport blocks in proportion to the expected number of Turbo decoding iterations for each of the transport blocks; and
Turbo decoding each of the transport blocks for no more than its determined maximum number of Turbo decoding iterations.

\* \* \* \* \*